(12) United States Patent
Yokoyama et al.

(10) Patent No.: US 8,993,214 B2
(45) Date of Patent: Mar. 31, 2015

(54) POSITIVE PHOTOSENSITIVE SILOXANE COMPOSITION

(75) Inventors: Daishi Yokoyama, Shizouka (JP); Takashi Fuke, Shizouka (JP); Yuji Tashiro, Shizouka (JO); Takashi Sekito, Shizouka (JP); Toshiaki Nonaka, Shizouka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 14/117,433

(22) PCT Filed: May 15, 2012

(86) PCT No.: PCT/JP2012/062356
§ 371 (c)(1),
(2), (4) Date: Nov. 13, 2013

(87) PCT Pub. No.: WO2012/161025
PCT Pub. Date: Nov. 29, 2012

(65) Prior Publication Data
US 2014/0335452 A1 Nov. 13, 2014

(30) Foreign Application Priority Data

May 20, 2011 (JP) .................................. 2011-113733

(51) Int. Cl.
*G03F 7/075* (2006.01)
*G03F 7/039* (2006.01)
*G03F 7/022* (2006.01)

(52) U.S. Cl.
USPC .......... 430/270.1; 430/18; 430/189; 430/311; 430/321; 430/322; 430/326; 430/905; 430/319

(58) Field of Classification Search
USPC ........ 430/270.1, 18, 189, 311, 319, 321, 326, 430/322, 905
See application file for complete search history.

(56) References Cited

U.S. PATENT DOCUMENTS

| 8,828,642 B2 * | 9/2014 | Kamogawa et al. ....... 430/270.1 |
| 2006/0192481 A1 | 8/2006 | Nagayama et al. |

(Continued)

FOREIGN PATENT DOCUMENTS

| JP | 2933879 B2 | 5/1999 |
| JP | 2961722 B2 | 8/1999 |

(Continued)

OTHER PUBLICATIONS

Machine Language English Abstract and Translation from JPO of JP 5-165214 A, which is also published as JP 2961722 B2.

(Continued)

*Primary Examiner* — Amanda C. Walke
(74) *Attorney, Agent, or Firm* — Sangya Jain

(57) ABSTRACT

A positive photosensitive siloxane composition comprising at least three types of following polysiloxanes (A), (B) and (C) obtained by hydrolyzing and condensing a silane compound represented by general formula (1) $R^1{}_n Si(OR^2)_{4-n}$, a diazonaphthoquinone derivative, and a solvent: a polysiloxane (A) such that if pre-baked the film thereof will be soluble in a 5 weight % TMAH aqueous solution and the solution rate of said film will be 1,000 Å/sec or less; a polysiloxane (B) such that if pre-baked the solution rate of the film thereof will be 4,000 Å/sec or more relative to a 2.38 weight % TMAH aqueous solution; and a polysiloxane (C) such that if pre-baked the solution rate of the film thereof will be between 200 and 3,000 Å/sec relative to a 2.38 weight % TMAH aqueous solution. (In the formula, $R^1$ represents a C1-20 linear or branched cyclic alkyl group, in which any methylene may be substituted by oxygen, or a C6-20 aryl group, in which any hydrogen may be substituted by fluorine; n represents a 0 or a 1; and $R^2$ represents a C1-5 alkyl group.)

20 Claims, 2 Drawing Sheets

(56) References Cited

U.S. PATENT DOCUMENTS

2011/0008730 A1* 1/2011 Hanamura et al. ......... 430/270.1
2013/0216952 A1 8/2013 Yokoyama et al.

FOREIGN PATENT DOCUMENTS

| JP | 3783512 B2 | 3/2006 |
| JP | 2006-236839 A | 9/2006 |
| JP | 2007-119777 A | 5/2007 |
| JP | 2007-193318 A | 8/2007 |
| JP | 2007-293160 A | 11/2007 |
| JP | 2009-276742 A | 11/2009 |
| JP | 2010-43030 A | 2/2010 |
| JP | 2011-81268 A | 4/2011 |
| WO | WO 2012/026400 A1 | 3/2012 |

OTHER PUBLICATIONS

Machine Language English Abstract from JPO of JP 9-152625 A, which is also published as JP 2933879 B2.

Machine Language English Abstract and Translation from JPO JP 2001-240757 A, which is also published as JP 3783512 B2.

Jean-Ho Song et al., "Views on the low-resistant bus materials and their process architecture for the large-sized & post-ultra definition TFT-LCD", IMID/IDMC/Asia Display 2008.

* cited by examiner

POSITIVE PHOTOSENSITIVE SILOXANE COMPOSITION

This application is a United States National Stage Patent Application under 35 U.S.C. §371 of International Patent Application No. PCT/JP2012/062356, filed May 15, 2012, which claims priority to Japanese Patent Applications No. 2011-113733, filed May 20, 2011, the contents of both documents being hereby incorporated herein by reference.

TECHNICAL FIELD

The present invention relates to a positive photosensitive siloxane composition, more specifically, to a positive photosensitive siloxane composition being able to form an optically transparent pattern with a resistance for a high temperature, a high chemical resistance, a resistance for environment, and reduced pattern lacks due to development residues, an undissolved residual layer, re-adhesion of slightly soluble materials, and the like at a development, and suitably used for a planarization film for a substrate of a thin film transistor (TFT) used in a back plane of a display such as a liquid crystal display element or an organic EL display element and an interlayer insulator for a semiconductor element as well as elements such as a solid image sensor, an antireflective film, an antireflective plate, an optical filter, a high luminance luminous diode, a touch panel, a solar cell, optical devices such as optical waveguide, and so on. The present invention further relates to a cured film formed by this positive photosensitive siloxane composition and aforementioned elements having the cured film.

BACKGROUND ART

In recent years, various proposals for further improvement of the light utilization efficiency and the energy saving in optical elements such as displays, light-emitting diodes, and solar cells have been done. For example, it has been known in a liquid crystal display to raise an aperture ratio of the display device by forming a transparent planarization film by application on a TFT element and then forming a pixel electrode on the planarization film (see the patent document 1 below). Further, in an organic EL device, it has been known to raise an aperture ratio thereof like a liquid crystal display by adoption of a top emission which is a method taking out emitted light by a luminous layer, which is formed on a transparent pixel electrode existing on a planarization layer formed on a TFT element by application, from the opposite side of a TFT element instead of a bottom emission which is a method taking out emitted light by a luminous layer, which is formed by a deposition on a transparent pixel electrode formed on a substrate, from the side of the substrate.

Furthermore, delay in signal on wiring becomes a problem accompanying to increasing in resolution, size, and picture quality as well as 3D indication of a display. An incoming signal to a TFT becomes shorter by increasing of writing speed of an image data (frame frequency) but there is a limit on linewidth extension of wiring for lowering a wiring resistance from a demand of high resolution. Because of this, it is proposed to solve the problem of signal delay by increasing the thickness of wiring (see the non-patent document 1 below).

As materials of the planarization film for the TFT substrate, there has been known a material in which an acrylic resin and a quinonediazide compound are combined (see patent documents 3 and 4 below). Though properties of the material do not deteriorate sharply at a high temperature of 200° C. or more, decomposition thereof begins gradually at a high temperature of 230° C. or more and there occur problems such as lowering of a film thickness and lowering of permeability due to coloring of a transparent layer by a high temperature processing of the substrate. Particularly, this material cannot be used in a process for forming a film on a layer of the material at a high temperature by use of devices such as a PE-CVD. Further, the material is not a best material for use in an organic EL element, as decomposition products thereof affect badly to the luminous efficiency and the life of an organic EL element. Furthermore, the acrylic material to which a heat resistance is given has a high dielectric constant generally. The material, therefore, has problems that electricity consumption becomes larger due to the increase in the parasitic capacitance of an insulation film and the picture quality decreases due to the delay in a driving signal of a liquid crystal element. The capacitance of the film can be made smaller by, for example, making a thickness of a film layer larger even if the film forming material is an insulate material with a large dielectric constant. However, formation of a thick film with a uniform film thickness is generally difficult. In addition, the amount of the material used becomes larger. The material, therefore, is not preferred.

Polysiloxanes, in particular, silsesquioxanes are known as materials with a high thermal resistance and a high transparency. Silsesquioxanes are polymers constructed by a three-functional siloxane structure unit: $RSi(O_{1.5})$ and are in between an inorganic silica $(SiO_2)$ and an organic silicone $(R_2SiO)$ with respect to the chemical structure. The polysiloxanes are singular compounds as it is, which are soluble in an organic solvent but a cured polysiloxane shows a high thermal resistance which is characteristic of inorganic silica. The polysiloxanes which are a component of a photosensitive composition need to dissolve in developers such as a tetramethylammonium hydroxide aqueous solution. There were proposed, therefore, a photosensitive composition comprising an acrylic copolymer copolymelized with a silsesquioxane compound in which an acrylic group is given to a particular caged silsesquioxane compound, an unsaturated carboxylic acid, an unsaturated compound containing an epoxy group, and an olefinic unsaturated compound, and a quinonediazide (see patent document 5 below). The compositions comprising complicated systems described above, however, give a cured material with an insufficient thermal resistance due to the thermal deterioration of organic compounds except for the polysiloxanes, as the amount of the organic compounds contained is large. The problems of coloration and gas generation due to the decomposition cannot be ignored.

As a photosensitive composition comprising a polysiloxane and a quinonediazide, there was proposed a photosensitive composition preventing a 'pattern' sagging, that is, hole or line patterns obtained after development flowing and as a result the resolution of the patterns becoming low at a heat curing, for example, by combining a system consisting of a polysiloxane which is insoluble in a developer and a polysiloxane which is soluble in a developer, and a quinonediazide compound (see patent document 6 below). If an insoluble polysiloxane in a developer is used, it will cause generating pattern lacks due to re-adhesion of slightly soluble materials or eluted insoluble materials during development.

As methods for retaining solubility in developer except a silanol group, there were proposed methods acylating a part of phenyl groups in phenylpolysiloxane (see patent document 7 below) and using a caged silsesquioxane compound having quinonediazide structure (see patent document 8 below). As these siloxanes have a stable developer-soluble group even if silanol groups react during development, problems of forming an insoluble layer and undissolved remains are reduced. The cured materials of these polysiloxanes, however, have poor resistance for chemicals such as a stripper for photoresist. These compounds have limit uses enabled.

CITATION LIST

Patent Documents

Patent document 1: JP 2933879 B
Patent document 2: JP 2006-236839 A
Patent document 3: JP 2961722 B
Patent document 4: JP 3783512 B
Patent document 5: JP 2007-119777 A
Patent document 6: JP 2007-193318 A
Patent document 7: JP 2010-043030 A
Patent document 8: JP 2007-293160 A Nonpatent Documents Non-patent document 1: IMID/IDMC/ASIA DISPLAY 2008 Digest, 9-12

DISCLOSURE OF THE INVENTION

Problems to be Solved by the Invention

The invention was made under the aforementioned situation. An object of the present invention is to provide a positive photosensitive siloxane composition which is able to form a pattern with a high resolution, a high heat-resistance, and a high transparency and has reduced pattern lacks due to re-adhesion of insoluble materials such as development residues and undissolved remains at the formation of a pattern.

Furthermore, another object of the present invention is to provide a cured film such as a planarization film for a substrate of a TFT and an interlayer insulator, which is formed by the aforementioned positive photosensitive siloxane composition; elements such as a liquid crystal display element, an organic EL display element, a solid image sensor, an antireflective film, an antireflective plate, an optical filter, a high luminance luminous diode, a touch panel, a solar cell, optical devices such as an optical waveguide, and a semiconductor element in which the cured film is contained.

Means for Solving the Problems

As a result of intensive studies and investigations, the present inventors found that in a positive photosensitive siloxane composition containing a polysiloxane, a diazonaphthoquinone derivative and a solvent, pattern lacks due to the adhesion of insoluble materials such as development residues and undissolved remains are reduced to be able to form a cured film with a high sensitivity, a high resolution, and a good residual film thickness and the obtained film is optically transparent, resistant at a high temperature, highly resistant to chemicals, and highly resistant to circumstances by use of at least three kinds of polysiloxanes having different dissolution rates respectively. The invention was accomplished based on this finding.

Namely, the present invention relates to a positive photosensitive siloxane composition, a cured film, and an element below.

(1) A positive photosensitive siloxane composition comprising polysiloxane (I), a diazonaphthoquinone derivative (II), and a solvent (III), wherein the polysiloxane (I) contains at least one of polysiloxane (Ia) below, at least one of polysiloxane (Ib) below, and at least one of polysiloxane (Ic) below.

(A) Polysiloxane (Ia):
Polysiloxane, a prebaked film of which is soluble in a 5 wt % tetramethylammonium hydroxide (hereinafter, refer to "5% TMAH") aqueous solution and which has a dissolution rate of 1,000 Å/second or less in a 5 wt % TMAH aqueous solution and is obtained by hydrolyzing and condensing, in the presence of an acidic or basic catalyst, a silane compound represented by the formula (1);

$$R^1_n Si(OR^2)_{4-n} \quad (1)$$

wherein $R^1$ represents a liner, branched or cyclic alkyl group having 1 to 20 carbon atoms, in which any methylene group may be replaced by an oxygen atom, or an aryl group having 6 to 20 carbon atoms, in which any hydrogen atom may be replaced by a fluorine atom, $R^2$ represents an alkyl group having 1 to 5 carbon atoms, and n is 0 or 1.

(B) Polysiloxane (Ib):
Polysiloxane, a prebaked film of which has a dissolution rate of 4,000 Å/second or more in a 2.38 wt % tetramethylammonium hydroxide (hereinafter, refer to "2.38% TMAH") aqueous solution and which is obtained by hydrolyzing and condensing the aforementioned silane compound represented by the formula (1) in the presence of an acidic or basic catalyst.

(C) Polysiloxane (Ic):
Polysiloxane, a prebaked film of which has a dissolution rate of 200 Å/second or more and 3,000 Å/second or less in a 2.38% TMAH aqueous solution and which is obtained by hydrolyzing and condensing the aforementioned silane compound represented by the formula (1) in the presence of an acidic or basic catalyst.

(2) The positive photosensitive siloxane composition described in the item (1) above, wherein the polysiloxane (Ia) is obtained by hydrolyzing and condensing the aforementioned silane compound in the presence of a basic catalyst.

(3) The positive photosensitive siloxane composition described in the item (1) or (2), wherein the ratio of a total weight of polysiloxanes (Ia) and (Ib) to a weight of polysiloxane (Ic) is 95/5 to 50/50.

(4) The positive photosensitive siloxane composition described in any one of the items (1) to (3), wherein the weight ratio of polysiloxanes (Ia) to polysiloxane (Ib) is 30/70 to 70/30.

(5) The positive photosensitive siloxane composition described in any one of the items (1) to (4), wherein silane compounds which constitute the polysiloxane (I) contains from 5 mole-% to 30 mole-% of silane compounds, 'n' in the formula (1) of which is zero.

(6) The positive photosensitive siloxane composition described in any one of the items (1) to (5), wherein silane compounds which constitute at least one of each of polysiloxanes (Ia), (Ib), and (Ic) contain from 20 mole-% to 80 mole-% of silane compounds on an average, $R^1$ in the formula (1) of which is a methyl group.

(7) The positive photosensitive siloxane composition described in the item (6), wherein silane compounds which constitute the polysiloxane (I) contain 20 mole-% to 80 mole-% of a silane compound on an average, $R^1$ in the formula (1) of which is a methyl group.

(8) A cured film which is formed from the positive photosensitive siloxane composition described in any one of the items (1) to (7) above.

(9) An element having the cured film described in the item (8)

Advantageous Effects of the Invention

The positive photosensitive siloxane composition of the invention has a high sensitivity and a high resolution. The cured film obtained from the composition has a good heat-resistant, a high transparency, and a good residual film thickness and pattern lacks due to re-adhesion of insoluble materials such as development residues and undissolved remains at development are reduced. In addition to these, as the planarization and electric insulation of the film are superior, the composition can be used suitably as various film forming materials for a planarization film for a substrate of a thin film transistor (TFT) used in a back plane of a display such as a liquid crystal display element or an organic EL display element, an interlayer insulator of a semiconductor element, and an insulator film or transparent protective film of a solid image sensor, an antireflective film, an antireflective plate, an optical filter, a high luminance luminous diode, a touch panel, a solar cell and so on as well as optical devices such as an optical waveguide.

MODE FOR CARRYING OUT THE INVENTION

Figure 1:
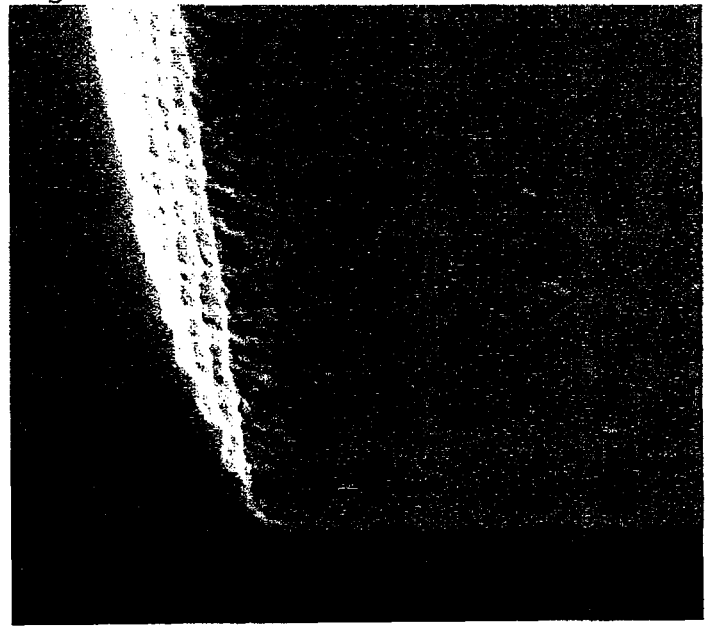
FIG. 1 is a SEM photomicrograph of a 5 μm line and space (L/S) pattern of the positive photosensitive siloxane composition obtained in Example 1 after development with a 2.38% TMAH aqueous solution.

Hereinafter, the positive photosensitive siloxane composition of the present invention will be more specifically explained.

The positive photosensitive siloxane composition of the invention is characterized by comprising at least three kinds or more of polysiloxanes having different dissolution rates in tetramethylammonium hydroxide aqueous solution each other, a diazonaphthoquinone derivative, and a solvent as described above. Polysiloxanes, diazonaphthoquinone derivatives, and solvents, which are used in the positive photosensitive polysiloxane composition of the invention, will be explained in detail in order below.

(I) Polysiloxanes

First, special features of polysiloxanes used in the invention will be explained.

Polysiloxanes used in the present invention include at least three kinds of polysiloxanes (Ia), (Ib) and (Ic), which have different dissolution rates in a tetramethylammonium hydroxide (TMAH) aqueous solution each other.

By the way, in the case where a photosensitive siloxane composition containing a diazonaphthoquinone derivative as a dissolution inhibitor is developed using a 2.38% TMAH aqueous solution as a developer, it is possible to form practically a positive pattern by exposure and development if the dissolution rate of the polysiloxane in a 2.38% TMAH aqueous solution is 100 Å/second or more. However, when used such composition, a 'pattern' sagging occurs in a process of a heat curing usually.

This 'pattern' sagging can be prevented by using polysiloxane with a low dissolution rate. However, as described in the patent document 6 above, when a molecular weight of polysiloxane is made larger and the polysiloxane is made slightly soluble in a developer of a 2.38% TMAH aqueous solution, problems such as decline of resolution caused by undissolved materials after development, deterioration of sensitivity, and pattern lacks after development are caused. As other polysiloxanes with a low dissolution rate, a structure having a low molecular weight and a silanol group such as a caged silsesquioxane is raised. Polysiloxane with a moderate dissolution rate in a 2.38% TMAH aqueous solution is able to be prepared by mixing a polysiloxane with a low dissolution rate in a 2.38% TMAH aqueous solution and a polysiloxane with a relatively high dissolution rate in a 2.38% TMAH aqueous solution.

The invention is characterized by that regardless the structure of polysiloxane, a polysiloxane with a low dissolution rate in a 2.38% TMAH aqueous solution and a polysiloxane with a relatively high dissolution rate in a 2.38% TMAH aqueous solution are mixed and then to these polysiloxanes a polysiloxane having a dissolution rate between these dissolution rates is further mixed, that is, at least three polysiloxanes are used.

In addition to this, the present invention is characterized by using a polysiloxane (Ia) slightly soluble in a 2.38% TMAH aqueous solution, soluble in a 5% TMAH aqueous solution, and having a dissolution rate of 1,000 Å/second or less in a 5% TMAH aqueous solution after prebaked, which is prepared by hydrolyzing and condensing a silane compound represented by the formula (1) $R^1{}_n Si(OR^2)_{4-n}$ in the presence of an acidic or basic catalyst, as the aforementioned polysiloxane with a low dissolution rate in a 2.38% TMAH aqueous solution. The polysiloxane (Ia) may be used in one kind or in combination with two kinds or more.

On the other hand, as the aforementioned polysiloxane with a relatively high dissolution rate in a 2.38% TMAH aqueous solution, there is used a polysiloxane (Ib) which is a polysiloxane prepared by hydrolyzing and condensing a silane compound represented by the formula (1) $R^1{}_n Si(OR^2)_{4-n}$ in the presence of an acidic or basic catalyst and has a dissolution rate of 4,000 Å/second or less in a 2.38% TMAH aqueous solution. The polysiloxane (Ib) is used in combination with the polysiloxane (Ia) which is slightly soluble in a 2.38% TMAH aqueous solution. The polysiloxane (Ib) may be used in one kind or in combination with two kinds or more thereof.

Furthermore, in the present invention, there is used at least one of polysiloxane (Ic) which is prepared by hydrolyzing and condensing a silane compound represented by the formula (1) and has a dissolution rate in a 2.38% TMAH aqueous solution between a dissolution rate of polysiloxane (Ia) and a dissolution rate of polysiloxane (Ib) in a 2.38% TMAH aqueous solution in addition to the polysiloxanes (Ia) and (Ib). The dissolution rate of the polysiloxanes (Ic) in a 2.38% TMAH aqueous solution is between 200 Å/second and 3,000 Å/second.

In addition, when the dissolution rate in a 2.38% TMAH aqueous solution of the aforementioned polysiloxane mixture, which consists of at least three kinds of polysiloxanes with different dissolution rates in a TMAH aqueous solution, is 100 Å/second to 1,000 Å/second, the mixture can compose a photosensitive polysiloxane composition using a 2.38% TMAH aqueous solution as a developer. Therefore, the amounts of at least these three kinds of polysiloxanes, specifically, the amounts of polysiloxanes (Ia), (Ib), and (Ic) are made to the amounts like that the dissolution rate of the mixture in a 2.38% TMAH aqueous solution fulfills 100 Å/second to 1,000 Å/second by taking the dissolution rates of polysiloxanes (Ia), (Ib), and (Ic) into consideration.

On the other hand, in the mixture of polysiloxanes (Ia), (Ib), and (Ic), when the content of a silica structure of n=0 is increased, a crosslink density of polysiloxane obtained increases and a heat sagging phenomenon of 'pattern' becomes to be moderated. Though the polysiloxane (Ia) has an anti-heat-sagging effect of 'pattern', increase of polysiloxane (Ia) is not preferred from a view point of development residues as the polysiloxane (Ia) contains slightly soluble ingredients. As the heat sagging phenomenon of 'pattern' is moderated by increasing the content of a silica structure as described above, a blending quantity of polysiloxane (Ia) can be reduced. However, if the content of the silica structure of n=0 increases excessively, the reaction activity of polysiloxane becomes higher and slightly soluble ingredients may be formed during development. From this, it is preferred that the content of the silica structure of n=0 in the formula (1) is from 5 mole-% to 30 mole-%. For example, it is preferred that the content of a silica structure of n=0 in polysiloxane (Ia) is 20 mole-% or less, the content of a silica structure of n=0 in polysiloxane (Ib) is 30 mole-% or less, and the content of a silica structure of n=0 in polysiloxane (Ic) is 30 mole-% or less.

When a pattern is formed using the positive photosensitive siloxane composition of the invention, the positive photosensitive siloxane composition is applied on a substrate to form a coated film, followed by exposure to light and development. After the development, the developed film is heated for forming a cured film at a temperature of preferably 200° C. or more. At this time, patterns after development sometimes flow. It is preferred for suppressing this heat flow and maintaining a pattern shape that the weight ratio of polysiloxane (Ia) to polysiloxane (Ib) is from 30/70 to 70/30. If the proportion of the polysiloxane (Ia) exceeds 70 weight parts, sensitivity thereof decreases remarkably and this composition will be not practical. Furthermore, it is preferred for getting rid of development residues that the weight ratio of the total amount of polysiloxanes (Ia) and (Ib) to polysiloxane (Ic) is from 95/5 to 50/50. If the proportion of the polysiloxane (Ic) is 5 weight parts or less, prevention of development residues is not enough. Further, if the proportion thereof is 50 weight parts or more, a problem of heat flow becomes evident as the proportion of polysiloxane (Ia) in a polysiloxane mixture is not enough.

Furthermore, it is preferred to use a polysiloxane synthesized by using a basic catalyst as the polysiloxane (Ia), as a photosensitive composition with good anti-'pattern' sagging effect is obtained using this polysiloxane.

A weight average molecular weight (Mw) of the polysiloxanes (Ia), (Ib) and (Ic) mixture is preferably 5,000 or less, more preferably about 1,000 to about 3,000. If the weight average molecular weight thereof is less than 1,000, an anti-'pattern' sagging effect will be small. On the other hand, if more than 5,000, sufficient resolution will be not obtained due to dissolution residues at development and the sensitivity is reduced.

Polysiloxanes (Ia), (Ib), and (Ic) used in the siloxane resin composition of the invention can be prepared by hydrolyzing and condensing siloxane compounds represented by the aforementioned formula (1) in the presence of an acidic or basic catalyst in an organic solvent.

The polysiloxanes (Ia), (Ib), and (Ic) will be explained specifically below. The difference of dissolution rates thereof can be adjusted by the length of the reaction time when an acidic catalyst is used and the amount of water charged into the reaction mixture when an basic catalyst is used. Therefore, the polysiloxanes (Ia), (Ib), and (Ic) can be prepared in the same procedures except adjusting the reaction time or the amount of water properly. Accordingly, if it is not necessary to distinguish the polysiloxanes (Ia), (Ib), and (Ic) each other, these will be sometimes called 'polysiloxane' simply below.

$R^1$ of the formula (1) $R^1{}_n Si(OR^2)_{4-n}$ which is needed for preparing polysiloxanes represents a liner, branched or cyclic alkyl group having 1 to 20 carbon atoms in which any methylene group may be replaced by an oxygen atom or an aryl group having 6 to 20 carbon atoms in which any hydrogen atom may be replaced by a fluorine atom; $R^2$ represents an alkyl group having 1 to 5 carbon atoms; and n is 0 or 1. The silane compounds represented by the formula (1) may be used in combination of two kinds or more thereof.

Examples of the liner, branched or cyclic alkyl group having 1 to 20 carbon atoms in which any methylene group may be replaced by an oxygen atom, in $R^1$ include a methyl group, an ethyl group, a n-propyl group, an isopropyl group, a t-butyl group, a n-hexyl group, a n-decyl group, a trifluoromethyl group, a 2,2,2-trifluoroethyl group, a 3,3,3-trifluoropropyl group, and a cyclohexyl group. Examples of the aryl group having 6 to 20 carbon atoms in which any hydrogen atom may be replaced by a fluorine atom, in $R^1$ include a phenyl group, a tolyl group, and a naphthyl group. Of these, the methyl group is preferred as the raw materials having this group can be easily available and a film hardness and a chemical resistance of the cured film thereof are high. Further, the phenyl group and the naphthyl group are preferred as these groups raise solubility of polysiloxane and prevent cracking of the cured film. The methyl group is particularly preferred.

When the methyl group is used as $R^1$, resistance against a resist remover of the obtained film will be poor if the content of the methyl group in $R^1$ of polysiloxane (I) is smaller. In contrast, if the content thereof is larger, the activity of siloxane becomes high and it causes the formation of insoluble materials. Therefore, it is preferred that the proportion of a silane compound wherein $R^1$ of the formula (1) in polysiloxane (I) is represented by a methyl group is from 20 mole-% to 80 mole-%. Further, in polysiloxanes (Ia), (Ib), and (Ic), it is preferred that at least any one of each of these polysiloxanes is that the proportion of a silane compound, which is used for preparing the polysiloxane and in which $R^1$ of the formula (1) is represented by a methyl group, is from 20 mole-% to 80 mole-%. Furthermore, in a mixture consisting of two kinds selected from the polysiloxanes (Ia), (Ib), and (Ic), it is also preferred that the proportion of silane compounds in which $R^1$ is represented by a methyl group in at least any one of the mixtures is 20 mole-% to 80 mole-%. Further, it is more preferred that the proportion of silane compounds in which $R^1$ is represented by a methyl group in all of the polysiloxanes (Ia), (Ib), and (Ic) is from 20 mole-% to 80 mole-%.

When the silane compound represented by the formula (1) consists of plural compounds, $R^1$'s of these silane compounds may be same or different each other. If a silane compound in which $R^1$ contains a methyl group is used, it is preferred to use a silane compound in which $R^1$ is a phenyl group, together with the silane compound containing a methyl group as other silane compounds represented by the formula (1).

On the other hand, examples of the alkyl group having 1 to 5 carbon atoms of $R^2$ include a methyl group, an ethyl group, a n-propyl group, an isopropyl group, and a n-butyl group. $R^2$ in the formula (1) may be same or different each other and when the silane compound represented by the formula (1) consists of plural compounds, $R^2$s of these silane compounds may be the same as or different from one another.

Specific examples of the silane compound represented by the formula (1) in which n is 1 include, but are not limited to, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, naphthyltrimethoxysilane, naphthyltriethoxysilane, naphthyltriisopropoxysilane, naphthylri-n-butoxysilane, trifluoromethyltrimethoxysilane, trifluoromethyltriethoxysilane, and 3,3,3-trifluoropropyltrimethoxysilane. Of these, methyltrimethoxysilane, methyltriethoxysilane, phenyltrimethoxysilane, and phenyltriethoxysilane are preferable compounds as being easily available.

Specific examples of the silane compound represented by the formula (1) in which n is zero include, but are not limited to, tetramethoxysilane, tetraethoxysilane, tetrapropoxysilane, and tetrabutoxysilane. Of these, tetramethoxysilane and tetraethoxysilane are preferred as these compounds have a high reactivity.

The polysiloxane of the invention is prepared by hydrolyzing and condensing the silane compound represented by the formula (1) in the presence of a basic or acidic catalyst.

In the production thereof, a mixture solution of the silane compounds represented by the formula (1) is added dropwise to a mixed solution of an organic solvent, a catalyst, and water to hydrolyze and condense the silane compounds, followed by neutralization, purification by washing, and condensation to remove reaction by-products and change the concentration as well as substitution of reaction solvent by a desired organic solvent, if necessary, thus the polysiloxane being produced.

Organic solvent used in the reaction may be used alone or in combination of two kinds or more thereof. Specific examples of the solvent include, but are not limited to, hydrocarbon solvents such as hexane, toluene, xylene, and benzene; ether solvents such as diethyl ether and tetrahydrofuran; ester solvents such as ethyl acetate, alcohol solvents such as methanol, ethanol, isopropanol, and butanol; and ketone solvents such as acetone, methyl ethyl ketone, and methyl isobutyl ketone. The amount thereof is 0.1 to 10 weight times, preferably 0.5 to 2 weight times a mixture solution of the silane compounds.

The dropping and reaction temperatures of the silane compound mixture solution both are 0° C. to 200° C., preferably 10° C. to 60° C. and these dropping and reaction temperatures may be the same as or different from one another. The reaction time is changed by substituent $R^2$ of the silane compound represented by the formula (1) but is usually from several ten minutes to several ten hours. Conditions at the hydrolysis and condensation reactions such as an amount of a catalyst, a reaction temperature, a reaction time etc. are set by considering a scale of reaction, a size of the reaction vessel, and the shape thereof. By these, polysiloxanes having suitable properties for an intended use can be obtained.

Examples of the basic catalyst include, but are not limited to, organic bases such as triethylamine, tripropylamine, tributylamine, tripentylamine, trihexylamine, triheptylamine, trioctylamine, diethylamine, triethanolamine, diethanolamine, and alkoxysilanes having amino group(s); inorganic bases such as sodium hydroxide and potassium hydroxide; anion exchange resins; quaternary ammonium salts such as tetrabutylammonium hydroxide, tetraethylammonium hydroxide, and tetramethylammonium hydroxide; and the like. The amount of the catalyst is preferably 0.0001 to 10 mole times a mixture of silane compounds.

Degree of hydrolysis can be adjusted by the amount of water added when a basic catalyst is used. The amount of water is changed by kinds and amounts of silane compounds used. When the polysiloxane (Ia) is synthesized, it is desirable to react water generally at a rate of 0.01 to 10 mole times, preferably 0.5 to 0.9 mole times a hydrolyzable alkoxy group of the silane compound represented by the formula (1). When the polysiloxane (Ib) is synthesized, it is desirable to react water generally at a rate of 0.01 to 10 mole times, preferably 1.4 to 2.0 mole times a hydrolyzable alkoxy group of the silane compound represented by the formula (1). When the polysiloxane (Ic) is synthesized, it is desirable to react water generally at a rate of 0.01 to 10 mole times, preferably 0.9 to 1.4 mole times a hydrolyzable alkoxy group of the silane compound represented by the formula (1).

After the reaction, the reaction solution may be neutralized to neutral pH or somewhat acidic side pH with an acidic compound as a neutralizing agent. Examples of the acidic compound include, but are not limited to, inorganic acids such as phosphoric acid, nitric acid, sulfuric acid, hydrochloric acid, and hydrofluoric acid; monovalent carboxylic acids such as acetic acid, trifluoroacetic acid, formic acid, lactic acid, and acrylic acid; polyvalent carboxylic acids such as oxalic acid, maleic acid, succinic acid, citric acid, and anhydrides thereof; organic acids, for example, sulfonic acids such as p-toluenesulfonic acid and methanesulfonic acid and so on; cationic ion-exchange resins; and the like.

The amount of the neutralizing agent is selected suitably according to the pH value of the reaction solution containing polysiloxane and is preferably 0.5 to 1.5 mole times, more preferably 1 to 1.1 mole times a basic catalyst.

On the other hand, examples of the acidic catalyst include, but are not limited to, hydrochloric acid, nitric acid, sulfuric acid, hydrofluoric acid, phosphoric acid, acetic acid, trifluoroacetic acid, formic acid, polyvalent carboxylic acids and anhydrides thereof, and ion exchange resins. The amount of the catalyst added, which can be changed by the strength of the acid, is preferably 0.0001 to 10 mole times the amount of a silane compound mixture.

When an acidic catalyst is used, degree of hydrolysis can be adjusted by the mixing time generally though it is changed by a kind or amount of silane compounds used. When preparing polysiloxane (Ia), the mixing time is preferably from 8 hours to 12 hours, when preparing polysiloxane (Ib), it is preferably from 1 hour to 5 hours, and when preparing polysiloxane (Ic), it is preferably from 5 hours to 12 hours, in general.

After the end of the reaction, the reaction solution obtained may be neutralized as with the case of using a basic catalyst. When an acidic catalyst is used, a basic compound is used as a neutralizer. Examples of the basic compounds used for the neutralization include organic bases such as triethylamine, tripropylamine, tributylamine, tripentylamine, trihexylamine, triheptylamine, trioctylamine, diethylamine, triethanolamine, and diethanolamine, inorganic bases such as sodium hydroxide and potassium hydroxide, anion exchange resins, and quaternary ammonium salts such as tetrabutylammonium hydroxide, tetraethylammonium hydroxide, and tetramethylammonium hydroxide. The amount of the neutralizer may be preferably 0.5 to 1.5 mole times, more preferably 1 to 1.1 mole times that of an acidic catalyst.

After neutralization, the neutralized solution may be washed and refined according to properties required to the coated film or the shelf life required to the solution. The washing and refining are conducted as follows. That is, a hydrophobic organic solvent and water if needed are added to the neutralized solution followed by mixing and contacting these to dissolve at least polysiloxane in the hydrophobic organic solvent. As the hydrophobic organic solvent, compounds which can dissolve polysiloxane but are immiscible with water may be used. The term "immiscible with water" means that water and a hydrophobic organic solvent are separated into two layers, a water layer and an organic layer when water and the organic solvent are left to stand after mixing sufficiently.

Preferred examples of the hydrophobic organic solvent include, but are not limited to, ether solvents such as diethyl ether, ester solvents such as ethyl acetate, alcohol solvents such as butanol, ketone solvents such as methyl ethyl ketone and methyl isobutyl ketone, aromatic solvents such as toluene and xylene, and the like. The hydrophobic organic solvent may be the same as or different from the reaction solvent used in the reaction of silane compounds. The solvent may be used alone or in combination of two kinds or more thereof. By washing of the reaction solution, most of the basic catalyst, the acidic catalyst, and the neutralizer which were used hitherto, and salts thereof as well as alcohol and water, which are byproducts of the reaction, are contained in the water layer and removed from the organic layer. Washing may be performed repeatedly according to properties required to a coated film and properties required to the solution such as the shelf life.

The temperature of washing is preferably 0° C. to 70° C., more preferably 10° C. to 60° C., but is not limited to these. Further, the temperature in separation of a water layer and an organic layer is also preferably 0° C. to 70° C., more preferably 10° C. to 60° C. from the viewpoint of shortening the separation time but is not limited to these.

After washing, the resulting hydrophobic organic solution containing a polysiloxane may be used as it is as a material for forming a coated film. However, depending on intended purposes, solvent and residual water and alcohol which are byproducts formed in the reaction process may be further removed by condensation. Furthermore, the concentration of the resulting organic solution may be changed or solvent in the resulting organic solution may be replaced with other solvent. The condensation may be conducted under an ordinary pressure (atmospheric pressure) or a reduced pressure and the degree of enrichment can be changed arbitrarily by controlling the amount of distillation. The temperature at the condensation is 30° C. to 150° C., preferably 40° C. to 100° C. The replacement of solvent may be conducted by adding desired solvent timely and then condensing so that an intended solvent composition can be obtained.

The polysiloxanes (Ia), (Ib), and (Ic) used in the siloxane resin composition of the invention can be prepared by the process described above and polysiloxane (I) is obtained by mixing these polysiloxanes.

In addition, as a 2.38% TMAH aqueous solution is generally used as a developer at the present time, the dissolution rates of polysiloxanes (Ia), (Ib) and (Ic) were set in aforementioned ranges. In the case where an aqueous solution having a different TMAH concentration is used as a developer, as long as dissolution rates of polysiloxane (Ib), polysiloxane (Ic) and polysiloxane (I) are made to result in the same ranges as those when a 2.38% TMAH aqueous solution was used, the same effect as the invention can be obtained. Furthermore, the same will apply when inorganic bases except for TMAH such as sodium hydroxide are used.

(Measurement and Calculation Methods of Alkali Dissolution Rate (ADR))

The dissolution rate in a TMAH aqueous solution of polysiloxanes (Ia), (Ib) and (Ic) or a mixture thereof is measured and calculated as follows.

First, a polysiloxane is diluted with and dissolved in propylene glycol monomenthyl ether acetate (PGMEA) so as to a concentration of about 35 wt %. The solution is spin-coated onto a silicon wafer so as to a dried film thickness of about 2 μm. After this, solvent in the coated film is further removed by heating on a hot plate at 100° C. for 60 seconds. The thickness of the dried film is measured with a spectroscopic ellipsometer manufactured by Woolliam Co. The silicon wafer with the film is immersed in a 5% TMAH aqueous solution in case of polysiloxane (Ia), and in a 2.38% TMAH aqueous solution in case of polysiloxane (Ib), polysiloxane (Ic), and a mixture of polysiloxanes (Ia), (Ib) and (Ic) at a room temperature (25° C.) and the time until the film disappears is measured. The dissolution rate is calculated by dividing the initial film thickness by the time until the film disappears. When the dissolution rate is remarkably slow, a film thickness after immersion for a predetermined time is measured and the dissolution rate is calculated by dividing a variation amount of a film thickness before and after immersion by an immersion time.

(II) Diazonaphthoquinone Derivatives

The photosensitive siloxane composition containing a diazonaphthoquinone derivative of the invention forms a positive type, in which the composition is removed by a developer due to that the exposed part thereof being solubilized to an alkaline developer. The diazonaphthoquinone derivative of the invention is a compound in which naphthoquinonediazide sulfonic acid is ester-linked to a compound having a phenolic hydroxyl group. The structure of the derivative is not limited particularly but an ester compound with a compound having one or more of phenolic hydroxyl groups is preferred. As the naphthoquinonediazide sulfonic acid, 4-naphthoquinonediazidesulfonic acid or 5-naphthoquinonediazidesulfonic acid can be used. 4-Naphthoquinonediazide sulfonate is suitable for an i-line (wave length: 365 nm) exposure as it has a light absorption in an i-line area. A 5-naphthoquinonediazide sulfonate compound is suitable for exposure at a wide wavelength area as it has a light absorption in a wide wavelength area. It is, therefore, preferred to select a 4-naphthoquinonediazide sulfonate compound or a 5-naphthoquinonediazide sulfonate compound according to wavelength of radiation used for exposure. The mixture of a 4-naphthoquinonediazide sulfonate compound and a 5-naphthoquinonediazide sulfonate compound may be used.

Unlimited examples of compounds having one or more of phenolic hydroxyl groups include, for example, following compounds. Names of the compounds are trade names of HONSHU CHEMICAL CO., LTD except for bisphenol A.

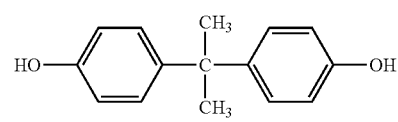

Bisphenol A

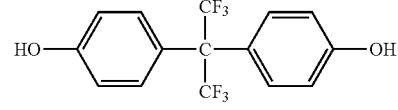

BisP-AF

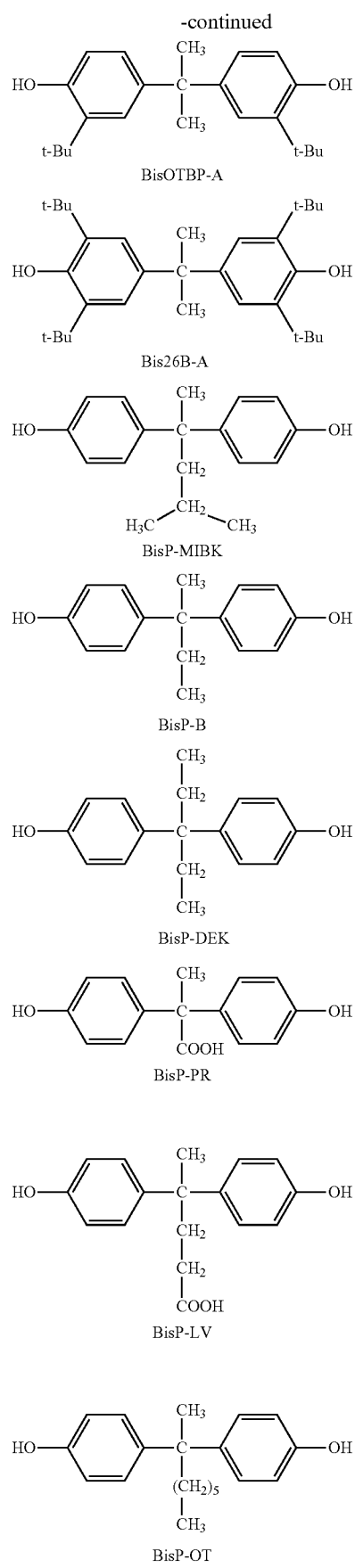
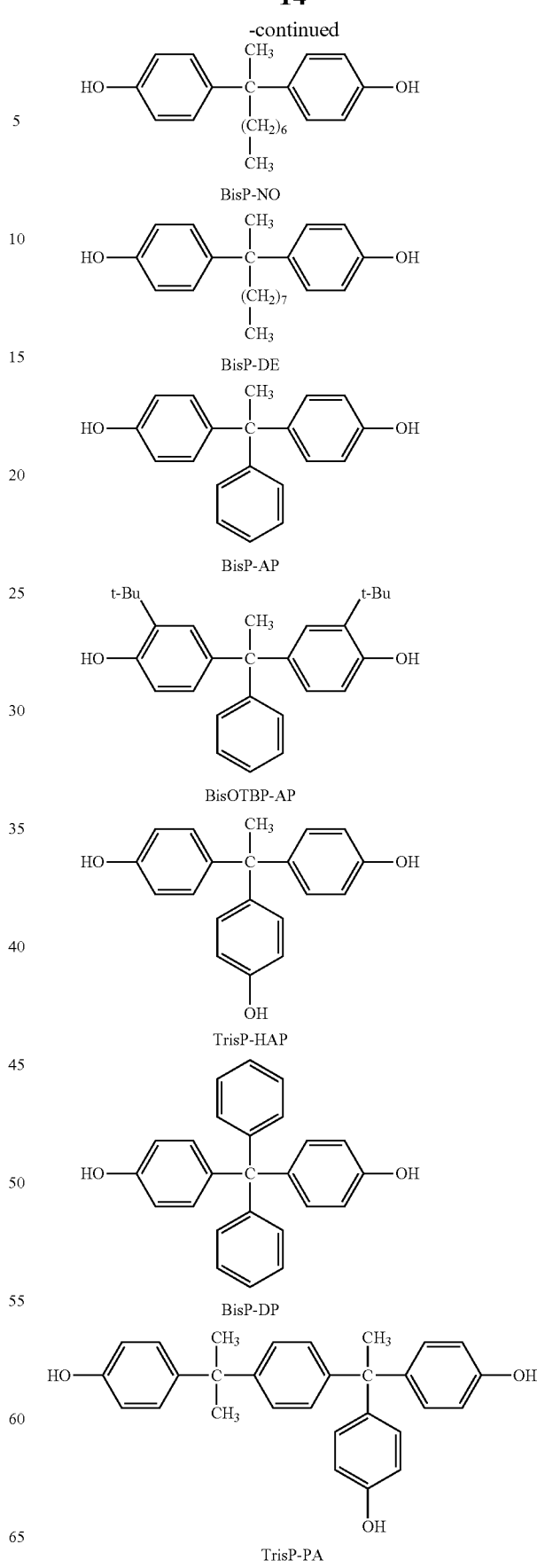

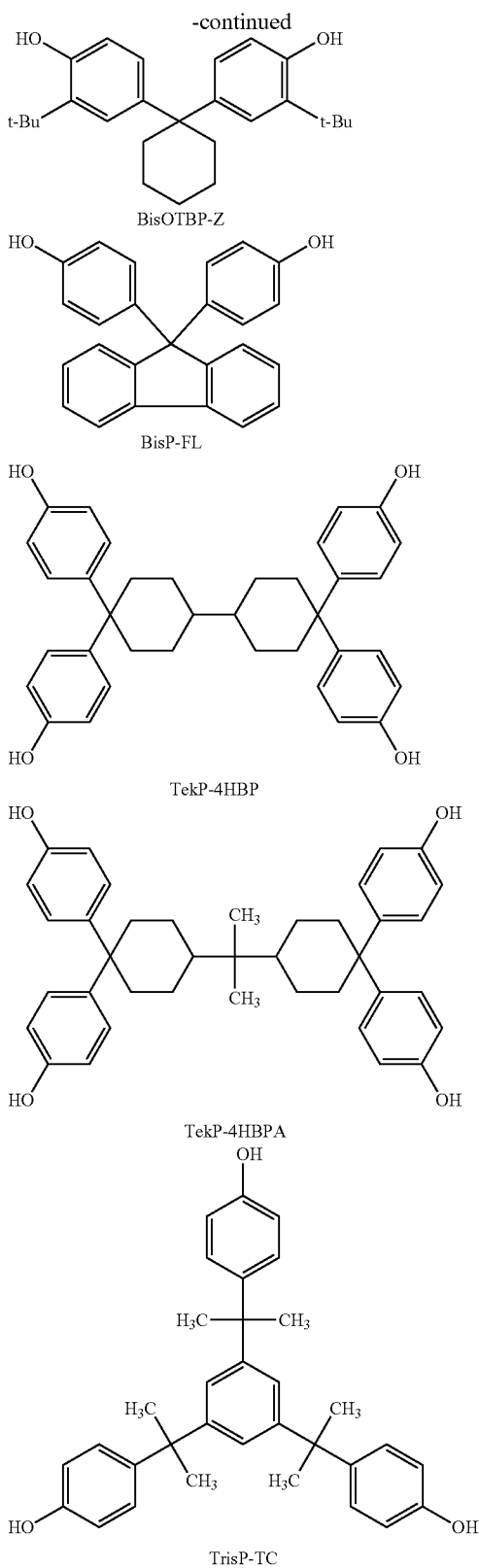

BisOTBP-Z

BisP-FL

TekP-4HBP

TekP-4HBPA

TrisP-TC

The optimal amount of the diazonaphthoquinone derivative differs depending on the esterification rate of naphthoquinonediazidesulfonic acid, physical properties of polysiloxane used, sensitivities required, and a dissolution contrast between an exposed part and an unexposed part, but the amount is preferably 3 to 20 wt %, more preferably 5 to 15 wt % relative to the total weight of polysiloxanes (Ia), (Ib), and (Ic). If the amount of the diazonaphthoquinone derivative is less than 3 wt %, the dissolution contrast between an exposed area and an unexposed area is too low and the photosensitive composition does not possess a realistic sensitivity. For obtaining better dissolution contrast, the amount is preferably 8 wt % or more. On the other hand, if the amount of the diazonaphthoquinone derivative is more than 20 wt %, whitening of the coated film can occur because of a fall of compatibility between the polysiloxane and the quinonediazide compound or colorlessness and transparency of the cured film can be decreased by that coloring of the film by decomposition of quinonediazide compounds which occur during the heat curing becomes evident. Further, the heat resistance of the diazonaphthoquinone derivative is lower than that of polysiloxane. Therefore, when the amount of the diazonaphthoquinone derivative becomes larger, thermal decomposition thereof causes the deterioration of electric insulation of the cured film or the release of gas from the cured film. These can become problems in the later steps. In addition, the resistance of the cured film for a photoresist stripper, which contains monoethanolamine and the like as a main agent, can be decreased.

(III) Solvent

Examples of solvent include, but are not limited to, ethylene glycol monoalkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl ether acetates such as methylcellosolve acetate and ethylcellosolve acetate; propylene glycol alkyl ether acetates such as propylene glycol monomethyl ether acetate (PGMEA), propylene glycol monoethyl ether acetate, and propylene glycol monopropyl ether acetate; aromatic hydrocarbons such as benzene, toluene, and xylene; ketones such as methyl ethyl ketone, acetone, methyl amyl ketone, methyl isobutyl ketone, and cyclohexanone; alcohols such as ethanol, propanol, butanol, hexanol, cyclohexanol, ethylene glycol, and glycerin; esters such as ethyl 3-ethoxypropionate and methyl 3-methoxypropionate; cyclic esters such as γ-butyrolactone; and so on. These solvents may be used singularly or in combination of two or more kinds thereof. The amount of the solvent differs because of application methods or demands of a coated film after application.

When the photosensitive siloxane composition is applied by a spray coating method, the proportion of solvent in the photosensitive siloxane composition becomes 90 wt % or more sometimes. In contrast, when applied by a slit coating method which is adopted in applying a large-sized substrate, the proportion of solvent is usually 60 wt % or more, preferably 70 wt % or more. The properties of the positive photosensitive siloxane composition according to the present invention do not change largely by the amount of solvent.

Further, surfactants may be contained in the positive photosensitive siloxane composition of the invention, if necessary. The surfactants are added for improving coating properties, developability, etc. As surfactants used in the present invention, there are exemplified nonionic surfactants, anionic surfactants, and amphoteric surfactants.

Examples of the nonionic surfactants include, but are not limited to, polyoxyethylene alkyl ethers such as polyoxyethylene lauryl ether, polyoxyethylene oleyl ether, and polyoxyethylene cetyl ether, polyoxyethylene fatty acid diesters, polyoxyethylene fatty acid monoesters, polyoxyethylene polyoxypropylene brock polymer, acetylene alcohols, acetylene glycols, polyethoxylates of acetylene alcohol, acetylene glycol derivatives such as polyethoxylates of acetylene glycol, fluorine atom-containing surfactants such as Fluorad (trade name, manufactured by Sumitomo 3M), Megafac (trade name, manufactured by DIC Corporation), and Sulflon (trade name, manufactured by ASAHI GLASS CO., LTD.), organic siloxane surfactants such as KP341 (trade name, manufactured by Shin-Etu Chemical Co., Ltd.), and so on. As the acetylene alcohols and acethylene glycols, there are exemplified 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Further, examples of the anionic surfactants include ammonium salts or organic amine salts of alkyldiphenyl ether disulfonic acid, ammonium salts or organic amine salts of alkyldiphenyl ether sulfonic acid, ammonium salts or organic amine salts of alkylbenzenesulfonic acid, ammonium salts or organic amine salts of polyoxyethylene alkyl ether sulfuric acid, and ammonium salts or organic amine salts of alkylsulfuric acid.

Furthermore, examples of the amphoteric surfactants include 2-alkyl-N-carboxymethyl-N-hydroxyethylimidazolium betaine and lauric acid amide propylhydroxysulfone betaine.

These surfactants can be used alone or in a combination of two or more thereof. The blending amount thereof is usually 50 to 2,000 ppm, preferably 100 to 1,000 ppm relative to the photosensitive siloxane composition of the invention.

Sensitizers may be contained in the photosensitive siloxane composition of the invention, if necessary. As sensitizers preferably used in the positive photosensitive siloxane composition of the invention, there are exemplified sensitizing dyes such as coumarins, ketocoumarins, and derivatives thereof, thiopyrylium salts, acetophenones, and the like, more specifically, for example, p-bis(o-methylstyryl)benzene, 7-dimethylamino-4-methylquinolone-2,7-amino-4-methyl-coumarin, 4,6-dimethyl-7-ethylaminocoumarin, 2-(p-dimethylaminostyryl)-pyridylmethyl iodide, 7-diethylaminocoumarin, 7-diethylamino-4-methylcoumarin, 2,3,5,6-1H,4H-tetrahydro-8-methylquinolizino-<9,9a,1-gh>-coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolizino-<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolizino-<9,9a,1-gh>-coumarin, 3-(2'-N-methylbenzimidazolyl)-7-N,N-diethylanimocoumarin, N-methyl-4-trifluoromethylpiperidino-<3,2-g>coumarin, 2-(p-dimethylaminostyryl)-benzothiazolylethyl iodide, 3-(2'-benzimidazolyl)-7-N,N-diethylaminocoumarin, 3-(2'-benzthiazolyl)-7-N,N-diethylaminocoumarin, and pyrylium or thiopyrylium salts represented by the formula described below. It will become possible to expose with cheap light sources such as a high pressure mercury lamp (irradiation wavelength: 360 to 430 nm) by addition of the sensitizing dye.

| X | $R_1$ | $R_2$ | $R_3$ | Y |
|---|---|---|---|---|
| S | $OC_4H_9$ | H | H | $BF_4$ |
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

The coated film of the photosensitive siloxane composition according to the present invention can be formed by a common coating method, that is, by any one of known coating methods as a photosensitive siloxane coating method, for example, a dip coating method, a roll coating method, a bar coating method, a brush coating method, a spray coating method, a doctor coating method, a flowing and spreading coating method, a spin coating method, a slit coating method and so on. The photosensitive siloxane composition may be applied to a suitable substrate such as a silicon substrate, a glass substrate, a resin film, and so on. When the substrate is a film, the application may be conducted by a gravure printing method. A drying process of the coated film may be provided in addition to a coating process, if necessary. The thickness of the coated film can be made to a desired thickness by applying one time or two times or more as necessary.

After forming a coated film of the photosensitive siloxane composition according to the invention, it is preferred to prebake (that is, heat-treat) for drying the coated film and reducing the amount of residual solvent in the coated film herewith. The heating temperature in the prebaking process may be usually 70° C. to 150° C., preferably 90° C. to 120° C. for 10 seconds to 180 seconds, preferably 30 seconds to 90 seconds when conducted on a hot plate or for 1 minute to 30 minutes when conducted in a clean oven.

Hereinafter a pattern forming method of the positive photosensitive siloxane composition according to the invention will be described. Intended patterns are formed by the following steps. First, a coated film of the positive photosensitive siloxane composition is formed on a substrate and prebaked. The film prebaked is then pattern-like exposed with a light. As the light source for exposure, lamps such as a high pressure mercury lamp, a low pressure mercury lamp, a metal halide lamp and a xenon lamp, a laser diode, LED etc. can be used. As the irradiating light, ultraviolet rays such as g-line, h-line, and i-line are used commonly. A Light having wave lengths of 360 nm to 430 nm (from a high pressure mercury lamp) is commonly used when a patterning with a resolution from several micrometers to dozens micrometers is conducted, except an ultra micro fabrication such as a semiconductor processing. Above all, in producing a liquid crystal display, a light with a wave length of 430 nm is used in many cases. In such cases, it is advantageous as previously stated to add a sensitizing dye to the photosensitive siloxane composition of the invention. Though energy of the irradiation light is changed by a light source used or an initial film thickness of the coated photosensitive siloxane composition, it is made to usually from 10 mJ/cm$^2$ to 2,000 mJ/cm$^2$, preferably from 20 mJ/cm$^2$ to 1,000 mJ/cm$^2$. When the energy of irradiation light is lower than 10 mJ/cm$^2$, the composition does not decompose fully. On the contrary, when the energy is higher than 2,000 mJ/cm$^2$, halation can occur by overexposure.

Photo masks utilized generally may be used for the pattern-like irradiation of the positive photosensitive siloxane composition according to the invention. These photo masks are well known by persons skilled in the art. Circumstances at the irradiation may be under the atmosphere of an environment (that is, in the atmosphere) or the atmosphere of nitrogen gas. Further, in the case of forming a cured film in a whole surface of the coated film, no exposure may be conducted after the positive photosensitive siloxane composition was applied over a whole surface of the substrate. In the invention, the meaning of a patterned film includes the case where a cured film is formed in a whole surface.

As a developer for development of the photosensitive siloxane composition according to the invention, any developer used for developing the conventional photosensitive siloxane compositions can be used. Preferred examples of the developer include alkali developers which are aqueous solutions of alkaline compounds such as tetramethylammonium hydroxide, choline, alkali metal hydroxide, (hydrated) metasilicate of alkali metal, (hydrated) phosphate of alkali metal, aqueous ammonia, alkyl amine, alkanol amine, heterocyclic amine, etc. Of these, a tetramethylammonium hydroxide aqueous solution is particularly preferred as the alkali developer. Water-soluble organic solvents such as methanol, ethanol, and the like or surfactants may be contained in the alkali developer. After development with an alkali developer, washing with water is conducted usually. After this, when the film is used as a transparent film, it is preferred to conduct an exposure for bleaching. Unreacted diazonaphthoquinone derivatives are photo-decomposed by the bleaching exposure and light transparency of the film is further improved. The bleaching exposure is conducted, for example, by whole exposure of the film at a dose of about 100 mJ/cm$^2$ to about 2,000 mJ/cm$^2$ (conversion to exposure value with a wavelength light of 365 nm) with ultraviolet and visible light exposure equipments such as a PLA.

After development, curing of the coated film is conducted by heating the pattern-like irradiated film. Heat conditions may be any temperature being able to cure the coated film and the heating temperature is usually 150° C. to 400° C., preferably 200° C. to 350° C. When the temperature is lower than 150° C., sufficient chemical resistant are not shown because unreacted silanol groups remain. Further, polarity of a silanol group induces a high dielectric constant. It is preferred, therefore, to cure the film at a temperature of 200° C. or more for lowering the dielectric constant.

The thus obtained crosslinked cured films have a thermal resistance of 400° C. or more, a light transmittance of 95% or more, and a relative dielectric constant of 4 or less, preferably 3.3 or less. As the film has a higher light transmittance and a lower relative dielectric constant than those of acrylic material so far used, it may be suitably utilized in diverse fields as a planarization film, an interlayer dielectric, and a transparent protective layer for aforementioned various elements such as a flat panel display (FPD), an interlayer dielectric for a low temperature polysilicon, a buffer coating film for IC chips, etc. Furthermore, the cured material can be used as materials for an optical device etc.

EXAMPLES

Hereinafter, the invention will be specifically described with reference to Examples and Comparative Examples. However, it should be understood that the present invention is not restricted by these Examples and Comparative Examples by no means.

Synthesis Examples

First, Synthesis examples of polysiloxane concerning the present invention will be shown below. Following instruments are utilized for measuring.

GPC: HLC-8220GPC manufactured by TOSOH CORPORATION

Spin coater: MS-A100 manufactured by MIKASA CO, LTD

Synthesis Example 1

Synthesis of polysiloxane Ia-1 in Table 1; Synthesis with an Alkali Catalyst

To a 2-liter flask equipped with a mixer, a thermometer, and a condenser, 36.5 g of 25 wt % tetramethylammonium hydroxide (TMAH) aqueous solution, 800 ml of isopropyl alcohol (IPA), and 2.0 g of water were charged. Apart from this, a mixture solution of 39.7 g of phenyltrimethoxysilane, 34.1 g of methyltrimethoxysilane, and 7.6 g of tetramethoxysilane were prepared in a dropping funnel. This mixture solution was added dropwise into the flask at 10° C. and then mixed for 3 hours at this temperature. The resulting solution was neutralized by adding 10% HCl aqueous solution. To the neutralized solution, 400 ml of toluene and 100 ml of water were added to separate the mixture solution into two layers. The thus obtained organic layer was concentrated under the reduced pressure to remove solvent and then propylene glycol monomenthyl ether acetate (PGMEA) was added to the concentrate so that the solid concentration thereof becomes 40 wt %.

The molecular weight (polystyrene conversion) of the thus obtained polysiloxane was 2,200 by weight-average molecular weight (hereinafter, refer to 'Mw') by measuring with GPC. The resin PGMEA solution obtained was applied onto a silicon wafer with a spin coater at 2 μm in thickness after prebaked and the resin film was prebaked. The dissolution rate of the prebaked resin film (hereinafter, refer to 'ADR') in a 5% TMAH aqueous solution was measured and ADR thereof was 490 Å/second.

Synthesis Example 2

Synthesis of Polysiloxane Ia-2 in Table 1; Synthesis with an Acid Catalyst

To a 2-liter flask equipped with a mixer, a thermometer, and a condenser, 1.6 g of a 35% HCl aqueous solution, 300 ml of PGMEA, and 27.4 g of water were charged. Apart from this, a mixture solution of 49.6 g of phenyltrimethoxysilane and 34.1 g of methyltrimethoxysilane were prepared in a dropping funnel. This mixture solution was added dropwise into the flask at 10° C. and then mixed for 10 hours at this temperature. To the reaction solution, 200 ml of toluene and 100 ml of water were added to separate the mixture solution into two layers. The thus obtained organic layer was concentrated under the reduced pressure to remove solvent and PGMEA was added to the concentrate so that the solid concentration thereof becomes 40 wt %. The molecular weight (polystyrene conversion) of the thus obtained polysiloxane and ADR in a 5% TMAH aqueous solution were measured in the same manner as in Synthesis example 1. Mw was 1,330 and ADR in a 5% TMAH aqueous solution was 160 Å/second.

Synthesis Example 3

Synthesis of Polysiloxane Ib-1 in Table 1; Synthesis with an Acid Catalyst

Polysiloxane was synthesized in the same manner as in Synthesis example 2 except that the mixing time after phenyltrimethoxysilane and methyltrimethoxysilane were added dropwise was changed to 3 hours. The molecular weight (polystyrene conversion) of the thus obtained polysiloxane was measured in the same manner as in Synthesis example 1. Mw thereof was 1,780. The thus obtained resin solution was applied onto a silicon wafer at 2 μm in thickness after prebaked with a spin coater and then prebaked. ADR of the prebaked resin film in a 2.38% TMAH aqueous solution was measured and ADR thereof was 11,100 Å/second.

Synthesis Example 4

Synthesis of Polysiloxane Ib-2 in Table 1; Synthesis with an Acid Catalyst

Polysiloxane was synthesized in the same manner as in Synthesis example 2 except that a mixture solution consisting of 39.7 g of phenyltrimethoxysilane, 34.1 g of methyltrimethoxysilane, and 7.6 g of tetramethoxysilane was used instead of a mixture solution consisting of 49.6 g of phenyltrimethoxysilane and 34.1 g of methyltrimethoxysilane and the mixing time was changed to 3 hours. The molecular weight (polystyrene conversion) of the thus obtained polysiloxane and ADR in a 2.38% TMAH aqueous solution were measured in the same manner as in Synthesis example 3. Mw was 1,590 and ADR in a 2.38% TMAH aqueous solution was 9,530 Å/second.

Synthesis Example 5

Synthesis of Polysiloxane Ib-3 in Table 1; Synthesis with an Alkali Catalyst 54.7 g of 25 wt % TMAH aqueous solution and 800 ml of IPA were charged in a flask in the same manner as in Synthesis example 1. Apart from this, a mixture solution consisting of 39.7 g of phenyltrimethoxysilane, 34.1 g of methyltrimethoxysilane, and 7.6 g of tetramethoxysilane was prepared in a dropping funnel. This mixture solution was added dropwise into the flask at 10° C. and then mixed for 3 hours at this temperature. The resulting solution was neutralized by adding 10% HCl aqueous solution. To the neutralized solution, 400 ml of toluene and 100 ml of water were added to separate the mixture solution into two layers. The thus obtained organic layer was concentrated under the reduced pressure to remove solvent and then PGMEA was added to the concentrate so that the solid concentration thereof becomes 40 wt %. The molecular weight (polystyrene conversion) of the thus obtained polysiloxane and ADR in a 2.38% TMAH aqueous solution were measured in the same manner as in Synthesis example 3. Mw was 1,720 and ADR in a 2.38% TMAH aqueous solution was 4,850 Å/second.

Synthesis Example 6

Synthesis of Polysiloxane Ic-1 in Table 1; Synthesis with an Acid Catalyst

Polysiloxane was synthesized in the same manner as in Synthesis example 3 except that a mixture solution consisting of 29.7 g of phenyltrimethoxysilane, 34.1 g of methyltrimethoxysilane, and 15.2 g of tetramethoxysilane was used instead of a mixture solution consisting of 49.6 g of phenyltrimethoxysilane and 34.1 g of methyltrimethoxysilane and the mixing time was changed to 6 hours. The molecular weight (polystyrene conversion) of the thus obtained polysiloxane and ADR in a 2.38% TMAH aqueous solution were measured in the same manner as in Synthesis example 3. Mw was 2,040 and ADR in a 2.38% TMAH aqueous solution was 1,100 Å/second.

Synthesis Example 7

Synthesis of Polysiloxane Ic-2 in Table 1; Synthesis with an Acid Catalyst

Polysiloxane was synthesized in the same manner as in Synthesis example 3 except that the mixing time after phenyltrimethoxysilane and methyltrimethoxysilane were added dropwise was changed to 8 hours. The molecular weight (polystyrene conversion) of the thus obtained polysiloxane and ADR in a 2.38% TMAH aqueous solution were measured in the same manner as in Synthesis example 3. Mw was 1,510 and ADR in a 2.38% TMAH aqueous solution was 390 Å/second.

Synthesis Example 8

Synthesis of Polysiloxane Ic-3 in Table 1; Synthesis with an Acid Catalyst

Polysiloxane was synthesized in the same manner as in Synthesis example 4 except that the mixing time after phenyltrimethoxysilane, methyltrimethoxysilane, and tetramethoxysilane were added dropwise was changed to 5 hours. The molecular weight (polystyrene conversion) of the thus obtained polysiloxane and ADR in a 2.38% TMAH aqueous solution were measured in the same manner as in Synthesis example 4. Mw was 1,890 and ADR in a 2.38% TMAH aqueous solution was 2,440 Å/second.

Synthesis Example 9

Synthesis of Polysiloxane of Comparison 1 in Table 1; Synthesis with an Alkali Catalyst Polysiloxane was synthesized in the same manner as in Synthesis example 1 except that a mixture solution consisting of 49.6 g of phenyltrimethoxysilane and 34.1 g of methyltrimethoxysilane was used instead of a mixture solution consisting of 39.7 g of phenyltrimethoxysilane, 34.1 g of methyltrimethoxysilane, and 7.6 g of tetramethoxysilane and the amount of water charged into the flask was changed to 1.0 g. The molecular weight (polystyrene conversion) of the thus obtained polysiloxane and ADR in a 2.38% TMAH aqueous solution were measured in the same manner as in Synthesis example 3. Mw was 1,520 and ADR in a 2.38% TMAH aqueous solution was 150 Å/second.

Synthesis Example 10

Synthesis of Polysiloxane of Comparison 2 in Table 1; Synthesis with an Acid Catalyst Polysiloxane was synthesized in the same manner as in Synthesis example 3 except that the mixing time after phenyltrimethoxysilane and methyltrimethoxysilane were added dropwise was changed to 10 hours. The molecular weight (polystyrene conversion) of the thus obtained polysiloxane and ADR in a 2.38% TMAH aqueous solution were measured in the same manner as in Synthesis example 3. Mw was 1,730 and ADR in a 2.38% TMAH aqueous solution was 160 Å/second.

Synthesis Example 11

Synthesis of Polysiloxane of Comparison 3 in Table 1; Synthesis with an Acid Catalyst Polysiloxane was synthesized in the same manner as in Synthesis example 3 except that the mixing time after phenyltrimethoxysilane and methyltrimethoxysilane were added dropwise was changed to 5 hours. The molecular weight (polystyrene conversion) of the thus obtained polysiloxane and ADR in a 2.38% TMAH aqueous solution were measured in the same manner as in Synthesis example 3. Mw was 1,790 and ADR in a 2.38% TMAH aqueous solution was 3,500 Å/second.

Ingredients and reaction catalysts used in the aforementioned synthesis examples and Mws and ADRs of polysiloxanes obtained are summarized in Table 1.

TABLE 1

| Synthesis example | compound | Ph (mole-%) | Me (mole-%) | Q (mole-%) | reaction catalyst | Molecular Weight (Mw) | ADR (Å/second)/TMAH 2.38% | 5% |
|---|---|---|---|---|---|---|---|---|
| 1 | Ia-1 | 40 | 50 | 10 | Alkali | 2,200 | | 490 |
| 2 | Ia-2 | 50 | 50 | 0 | Acid | 1,330 | | 160 |
| 3 | Ib-1 | 50 | 50 | 0 | Acid | 1,780 | 11,100 | |
| 4 | Ib-2 | 40 | 50 | 10 | Acid | 1,590 | 9,530 | |
| 5 | Ib-3 | 40 | 50 | 10 | Alkali | 1,720 | 4,850 | |
| 6 | Ic-1 | 30 | 50 | 20 | Acid | 2,040 | 1,100 | |
| 7 | Ic-2 | 50 | 50 | 0 | Acid | 1,510 | 390 | |
| 8 | Ic-3 | 40 | 50 | 10 | Acid | 1,890 | 2,440 | |
| 9 | Comparison 1 | 50 | 50 | 0 | Alkali | 1,520 | 150 | |
| 10 | Comparison 2 | 50 | 50 | 0 | Acid | 1,730 | 160 | |
| 11 | Comparison 3 | 50 | 50 | 0 | Acid | 1,790 | 3,500 | |

(Ph: phenyltrimethoxysilane, Me: methyltrimethoxysilane, Q: tetramethoxysilane)

Example 1

Positive Photosensitive Siloxane Composition

Polysiloxane Ia-1, polysiloxane Ib-1, and polysiloxane Ic-1 were mixed at the rate of 40 wt % to 30 wt % to 30 wt % respectively. The mixture was prepared to a 35% concentration solution using PGMEA and 12 wt % of a modified compound of 4-4'-(1-(4-(1-(4-hydroxyphenol)-1-methylethyl)-phenyl)ethylidene)bisphenol with 2.0 moles of diazonaphthoquinone (refer to 'PAC' below) relative to the total weight of polysiloxanes were added to the polysiloxane mixture. 0.3 wt % of a surfactant, KF-53 manufactured by Shin-Etsu Chemical Co., Ltd. relative to the total weigh of polysiloxanes were further added thereto to prepare a photosensitive siloxane composition.

Figure 2:
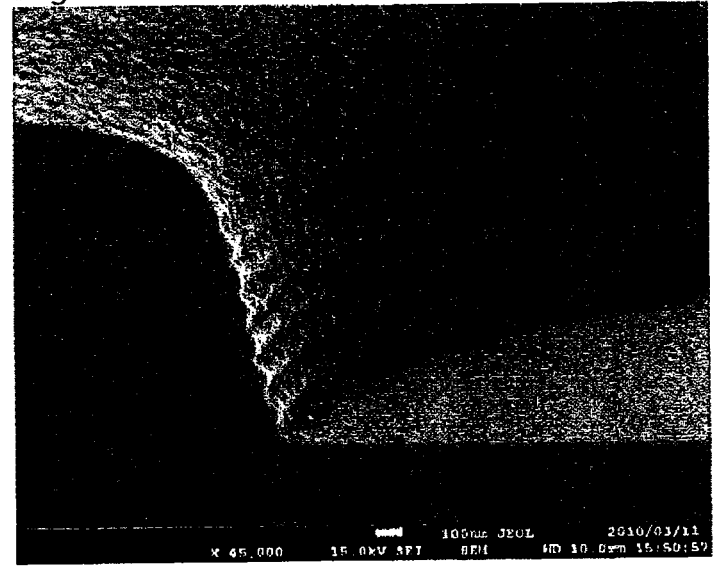
FIG. 2 is a SEM photomicrograph of a 5 μm contact hole (C/H) pattern of the positive photosensitive siloxane composition obtained in Example 1 after development with a 2.38% TMAH aqueous solution.

The photosensitive polysiloxane composition was applied onto a silicon wafer by a spin coating followed by prebaking on a hot plate at 100° C. to prepare a photosensitive layer with 2 μm in thickness. After prebaking, it was exposed with g- and h-lines from an exposure machine, Nikon FX-604 (NA-0.1) at a dose of 180 mJ/cm² and then developed with a 2.38% TMAH aqueous solution followed by rinsing with pure water. It was confirmed by observation of the developed patterns with SEM that 5 μm clear line and space (L/S) patterns and 5 μm clear contact hole (C/H) patterns, which have no residue, were formed. A SEM photograph of the line and space (L/S) pattern is shown in FIG. 1 and a SEM photograph of the contact hole (C/H) pattern is shown in FIG. 2.

Example 2

Positive Photosensitive Siloxane Composition

A photosensitive siloxane composition was prepared in the same manner as in Example 1 except for changing the rate of polysiloxanes to Ia-1: Ib-2: Ic-1=40 wt %:30 wt %:30 wt %. The photosensitive siloxane composition was applied, exposed, developed and rinsed in the same manner as in Example 1. It was confirmed by observation of the developed patterns with SEM that 5 μm clear line and space (L/S) patterns and 5 μm clear contact hole (C/H) patterns having no residue respectively were formed.

Example 3

Positive Photosensitive Siloxane Composition

A photosensitive siloxane composition was prepared in the same manner as in Example 1 except for changing the rate of polysiloxanes to Ia-1: Ib-3: Ic-1=40 wt %:30 wt %:30 wt % and exposing at a dose of 220 mJ/cm². The photosensitive siloxane composition was applied, exposed, developed and rinsed in the same manner as in Example 1. It was confirmed by observation of the developed patterns with SEM that 5 μm clear line and space (L/S) patterns and 5 μm clear contact hole (C/H) patterns having no residue respectively were formed.

Example 4

Positive Photosensitive Siloxane Composition

A photosensitive siloxane composition was prepared in the same manner as in Example 1 except for changing the rate of polysiloxanes to Ia-1: Ib-3: Ic-2=40 wt %:30 wt %:30 wt % and exposing at a dose of 220 mJ/cm². The photosensitive siloxane composition was applied, exposed, developed and rinsed in the same manner as in Example 1. It was confirmed by observation of the developed patterns with SEM that 5 μm clear line and space (L/S) patterns and 5 μm clear contact hole (C/H) patterns having no residue respectively were formed.

Example 5

Positive Photosensitive Siloxane Composition

A photosensitive siloxane composition was prepared in the same manner as in Example 1 except for changing the rate of polysiloxanes to Ia-1: Ib-3: Ic-3=40 wt %:35 wt %:25 wt % and exposing at a dose of 190 mJ/cm$^2$. The photosensitive siloxane composition was applied, exposed, developed and rinsed in the same manner as in Example 1. It was confirmed by observation of the developed patterns with SEM that 5 μm clear line and space (L/S) patterns and 5 μm clear contact hole (C/H) patterns having no residue respectively were formed.

Example 6

Positive Photosensitive Siloxane Composition

A photosensitive siloxane composition was prepared in the same manner as in Example 1 except for changing the rate of polysiloxanes to Ia-2: Ib-2: Ic-2=35 wt %:45 wt %:20 wt %. The photosensitive siloxane composition was applied, exposed, developed and rinsed in the same manner as in Example 1. It was confirmed by observation of the developed patterns with SEM that 5 μm clear line and space (L/S) patterns and 5 μm clear contact hole (C/H) patterns having no residue respectively were formed.

Example 7

Positive Photosensitive Siloxane Composition

A photosensitive siloxane composition was prepared in the same manner as in Example 1 except for changing the rate of polysiloxanes to Ia-2:Ic-1=35 wt %:40 wt %:25 wt %. The photosensitive siloxane composition was applied, exposed, developed and rinsed in the same manner as in Example 1. It was confirmed by observation of the developed patterns with SEM that 5 μm clear line and space (L/S) patterns and 5 μm clear contact hole (C/H) patterns having no residue respectively were formed.

Example 8

Positive Photosensitive Siloxane Composition

A photosensitive siloxane composition was prepared in the same manner as in Example 1 except for changing the rate of polysiloxanes to Ia-2:Ic-3=35 wt %:35 wt %:30 wt %. The photosensitive siloxane composition was applied, exposed, developed and rinsed in the same manner as in Example 1. It was confirmed by observation of the developed patterns with SEM that 5 μm clear line and space (L/S) patterns and 5 μm clear contact hole (C/H) patterns having no residue respectively were formed.

Comparative Example 1

Positive Photosensitive Siloxane Composition

Figure 3:
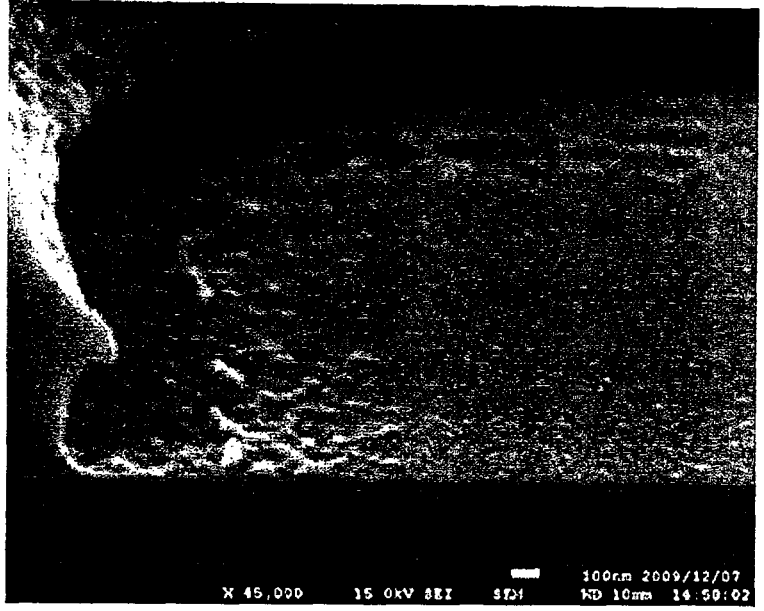
FIG. 3 is a SEM photomicrograph of a 5 μm contact hole (C/H) pattern of the positive photosensitive siloxane composition obtained in Comparative example 1 after development with a 2.38% TMAH aqueous solution.

A photosensitive siloxane composition was prepared in the same manner as in Example 1 except for changing the rate of polysiloxanes to Ia-1: Ib-2=65 wt %:35 wt %. The photosensitive siloxane composition was applied, exposed, developed and rinsed in the same manner as in Example 1 except that the exposure was conducted at a dose of 130 mJ/cm$^2$. After this, observation of the developed patterns with SEM was conducted. It was confirmed by the observation that development residues existed in all of 5 μm and 10 μm line and space (L/S) patterns and 5 μm and 10 μm contact hole (C/H) patterns. Particularly, in the 5 μm contact hole (C/H) patterns, an undissolved layer remained on the entire surface. A SEM photograph of the 5 μm contact hole (C/H) pattern is shown in FIG. 3.

Comparative Example 2

Positive Photosensitive Siloxane Composition

A photosensitive siloxane composition was prepared in the same manner as in Example 1 except for changing the rate of polysiloxanes to Ia-1: Ib-2: comparison 1=42 wt %:28 wt %:30 wt %. The photosensitive siloxane composition was applied, exposed, developed and rinsed in the same manner as in Example 1 except that the exposure was conducted at a dose of 130 mJ/cm$^2$. It was confirmed by observation of the developed patterns with SEM that development residues existed in 5 μm contact hole (C/H) patterns.

Comparative Example 3

Positive Photosensitive Siloxane Composition

Figure 4:
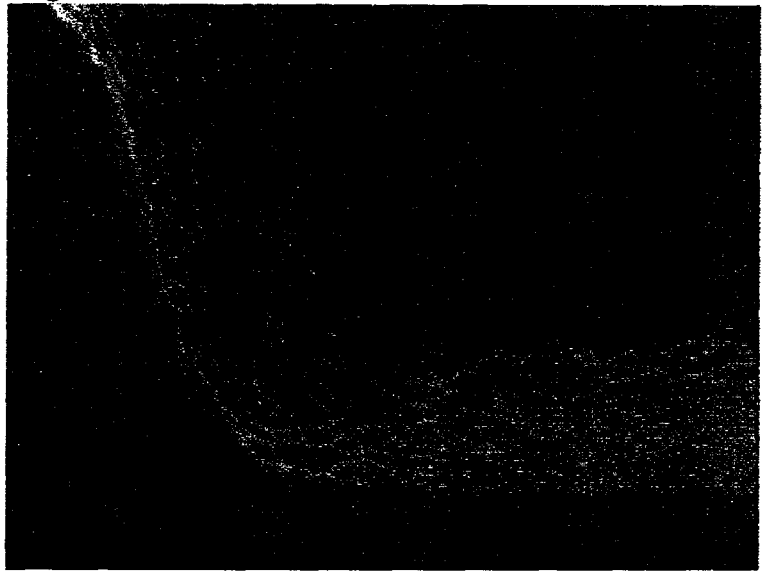
FIG. 4 is a SEM photomicrograph of a 5 μm contact hole (C/H) pattern of the positive photosensitive siloxane composition obtained in Comparative example 3 after development with a 2.38% TMAH aqueous solution.

A photosensitive siloxane composition was prepared in the same manner as in Example 1 except for changing the rate of polysiloxanes to Ia-1: Ib-2: comparison 2=42 wt %:28 wt %:30 wt %. The photosensitive siloxane composition was applied, exposed, developed and rinsed in the same manner as in Example 1 except that the exposure was conducted at a dose of 130 mJ/cm$^2$. It was confirmed by observation of the developed patterns with SEM that development residues existed in 5 μm contact hole (C/H) patterns. A SEM photograph of the 5 μm contact hole (C/H) patterns is shown in FIG. 4.

Comparative Example 4

Positive Photosensitive Siloxane Composition

A photosensitive siloxane composition was prepared in the same manner as in Example 1 except for changing the rate of polysiloxanes to Ib-2: comparison 1=35 wt %:65 wt %. The photosensitive siloxane composition was applied, exposed, developed and rinsed in the same manner as in Example 1 except that the exposure was conducted at a dose of 150 mJ/cm$^2$. It was confirmed by observation of the developed patterns with SEM that development residues existed in the 10 μm contact hole (C/H) patterns.

Comparative Example 5

Positive Photosensitive Siloxane Composition

A photosensitive siloxane composition was prepared in the same manner as in Example 1 except for changing the rate of polysiloxanes to Ia-1: Ib-2: comparison 3=35 wt %:35 wt %:30 wt %. The photosensitive siloxane composition was applied, exposed, developed and rinsed in the same manner as in Example 1 except that the exposure was conducted at a dose of 160 mJ/cm². It was confirmed by observation of the developed patterns with SEM that development residues existed on a side wall around a hole of the 5 μm contact hole (C/H) pattern.

Photosensitive siloxane compositions of Examples 1 to 8 and Comparative examples 1 to 5 are summarized in Tables 2.

TABLE 2

|  | Ia (parts) | Ib (parts) | Ic (parts) | Scum in C/H patterns |
|---|---|---|---|---|
| Example 1 | Ia-1 (40) | Ib-1 (30) | Ic-1 (30) | None (see FIGS. 1 and 2) |
| Example 2 | Ia-1 (40) | Ib-2 (30) | Ic-1 (30) | None |
| Example 3 | Ia-1 (40) | Ib-3 (30) | Ic-1 (30) | None |
| Example 4 | Ia-1 (40) | Ib-3 (30) | Ic-2 (30) | None |
| Example 5 | Ia-1 (40) | Ib-3 (35) | Ic-3 (25) | None |
| Example 6 | Ia-2 (35) | Ib-2 (45) | Ic-2 (20) | None |
| Example 7 | Ia-2 (35) | Ib-2 (40) | Ic-1 (25) | None |
| Example 8 | Ia-2 (35) | Ib-2 (35) | Ic-3 (30) | None |
| Comparative example 1 | Ia-1 (65) | Ib-2 (35) | — | Undissolved residues exist and cover the entire surface. (see FIG. 3) |
| Comparative example 2 | Ia-1 (42) | Ib-2 (28) | Comparison 1 (30) | Scum exists in the entire surface. |
| Comparative example 3 | Ia-1 (42) | Ib-2 (28) | Comparison 2 (30) | The amount of scum in the center part is small but that in the side wall is large. (See FIG. 4). |
| Comparative example 4 | — | Ib-2 (35) | Comparison 1 (65) | Undissolved layers exist over the entire surface. |
| Comparative example 5 | Ia-1 (35) | Ib-2 (35) | Comparison 3 (30) | The amount of scum in the center part is small but that in the side wall is large. |

The invention claimed is:

1. A positive photosensitive siloxane composition comprising polysiloxane (I), a diazonaphthoquinone derivative (II), and a solvent (III),
wherein the polysiloxane (I) contains at least one of polysiloxane (Ia) below, at least one of polysiloxane (Ib) below, and at least one of polysiloxane (Ic) below,
(A) Polysiloxane (Ia): a polysiloxane, where a prebaked film of which is soluble in a 5 wt % tetramethylammonium hydroxide aqueous solution and which has a dissolution rate of 1,000 Å/second or less in a 5 wt % tetramethylammonium hydroxide aqueous solution and is obtained by hydrolyzing and condensing, in the presence of an acidic or basic catalyst, a silane compound represented by the formula (1);

$$R^1{}_n Si(OR^2)_{4-n} \quad (1)$$

wherein $R^1$ represents a linear, branched or cyclic alkyl group having 1 to 20 carbon atoms, in which any methylene group may be replaced by an oxygen atom, or an aryl group having 6 to 20 carbon atoms, in which any hydrogen atom may be replaced by a fluorine atom, $R^2$ represents an alkyl group having 1 to 5 carbon atoms, and n is 0 or 1,
(B) Polysiloxane (Ib): a polysiloxane, where a prebaked film of which has a dissolution rate of 4,000 Å/second or more in a 2.38 wt % tetramethylammonium hydroxide aqueous solution and which is obtained by hydrolyzing and condensing the silane compound represented by the formula (1) in the presence of an acidic or basic catalyst,
(C) Polysiloxane (Ic): a polysiloxane, where a prebaked film of which has a dissolution rate of 200 Å/second or more and 3,000 Å/second or less in a 2.38% tetramethylammonium hydroxide aqueous solution and which is obtained by hydrolyzing and condensing the silane compound represented by the formula (1) in the presence of an acidic or basic catalyst.

2. The positive photosensitive siloxane composition according to claim 1, wherein the polysiloxane (Ia) is obtained by hydrolyzing and condensing the aforementioned silane compound in the presence of a basic catalyst.

3. The positive photosensitive siloxane composition according to claim 1, wherein the ratio of a total weight of polysiloxanes (Ia) and (Ib) to a weight of polysiloxane (Ic) is 95/5 to 50/50.

4. The positive photosensitive siloxane composition according to claim 1, wherein the weight ratio of polysiloxanes (Ia) to polysiloxane (Ib) is 30/70 to 70/30.

5. The positive photosensitive siloxane composition according to claim 1, wherein silane compounds which constitute the polysiloxane (I) contains from 5 mole-% to 30 mole-% of silane compounds, 'n' in the formula (1) of which is zero.

6. The positive photosensitive siloxane composition according to claim 1, wherein silane compounds which constitute at least one of each of polysiloxanes (Ia), (Ib), and (Ic) contain from 20 mole-% to 80 mole-% of silane compounds on an average, and in which $R^1$ in the formula (1) is a methyl group.

7. The positive photosensitive siloxane composition according to claim 6, wherein silane compounds which constitute the polysiloxane (I) contain 20 mole-% to 80 mole-% of a silane compound on an average, and in which $R^1$ in the formula (1) is a methyl group.

8. A cured film which is formed from the positive photosensitive siloxane composition according to claim 1.

9. An element having the cured film according to claim 8.

10. The positive photosensitive siloxane composition according to claim 1 wherein $R^1$ of the formula (1) is selected from the group consisting of a methyl group, an ethyl group, a n-propyl group, an isopropyl group, a t-butyl group, a n-hexyl group, a n-decyl group, a trifluoromethyl group, a 2,2,2-trifluoroethyl group, a 3,3,3-trifluoropropyl group, and a cyclohexyl group.

11. The positive photosensitive siloxane composition according to claim 1 wherein the aryl group having 6 to 20 carbon atoms in which any hydrogen atom may be replaced by a fluorine group is selected from the group consisting of a phenyl group, a tolyl group, and a naphthyl group.

12. The positive photosensitive siloxane composition according to claim 1 wherein $R^2$ of the formula (1) is selected from the group consisting of a methyl group, an ethyl group, a n-propyl group, an isopropyl group, and a n-butyl group.

13. The positive photosensitive siloxane composition according to claim 1 wherein the silane represented by formula (1) in which n is 1 is selected from the group consisting of methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, naphthyltrimethoxysilane, naphthyltriethoxysilane, naphthyltriisopropoxysilane, naphthytri-n-butoxysilane, trifluoromethyltrimethoxysilane, trifluoromethyltriethoxysilane, and 3,3,3-trifluoropropyltrimethoxysilane.

14. The positive photosensitive siloxane composition according to claim 1 wherein the silane represented by formula (1) in which n is 1 is selected from the group consisting of methyltrimethoxysilane, methyltriethoxysilane, phenyltrimethoxysilane, and phenyltriethoxysilane.

15. The positive photosensitive siloxane composition according to claim 1 wherein the silane represented by formula (1) in which n is 0 is selected from the group consisting of tetramethoxysilane, tetraethoxysilane, tetrapropoxysilane, and tetrabutoxysilane.

16. The positive photosensitive siloxane composition according to claim 1 wherein the silane represented by formula (1) in which n is 0 is selected from the group consisting of tetramethoxysilane and tetraethoxysilane.

17. The positive photosensitive siloxane composition according to claim 1
where the diazonaphthoquinone derivative (II) is a compound in which a naphthoquinonediazide sulfonic acid is ester-linked to a compound having a phenolic hydroxyl group.

18. The positive photosensitive siloxane composition according to claim 17 where the compound with a phenolic hydroxyl group has one or more of phenolic hydroxyl groups.

19. The positive photosensitive siloxane composition according to claim 17 where the naphthoquinonediazide sulfonic is 4-naphthoquinonediazidesulfonic acid or 5-naphthoquinonediazidesulfonic acid.

20. The positive photosensitive siloxane composition according to claim 17 where the phenolic hydroxyl compounds is selected from the group consisting of the following compounds;

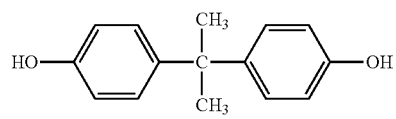
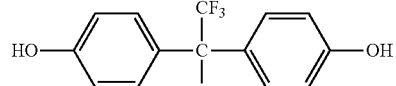
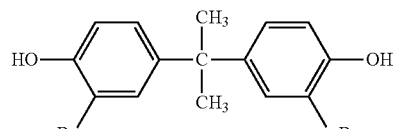
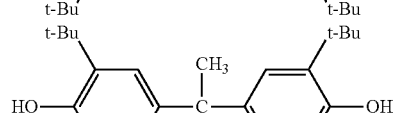
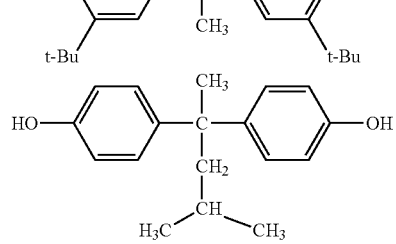

-continued

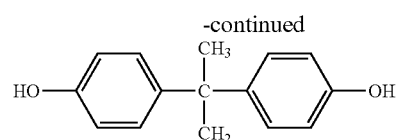
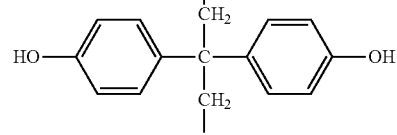
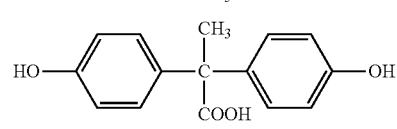
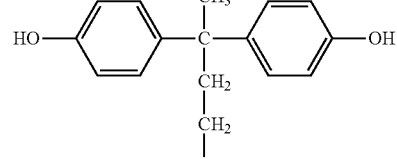
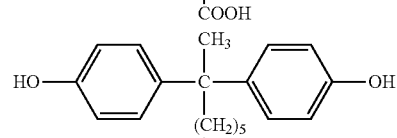
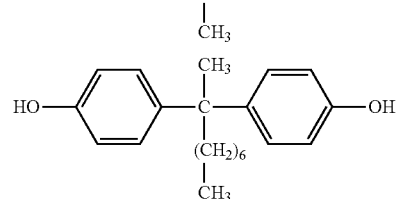
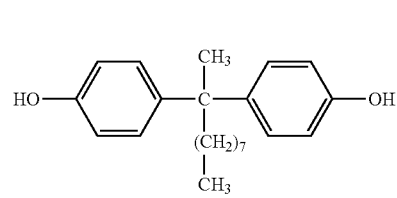
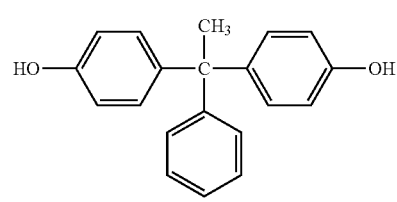
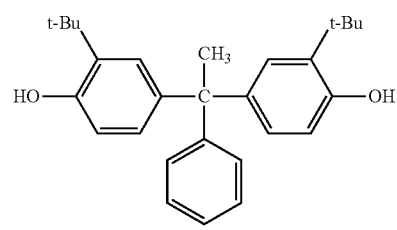

-continued
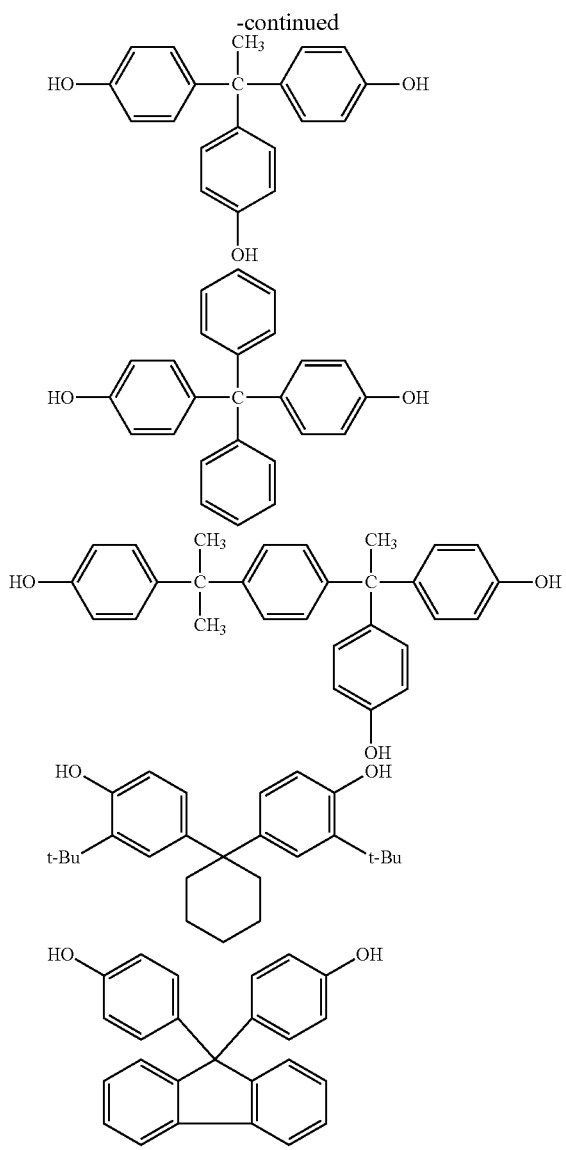
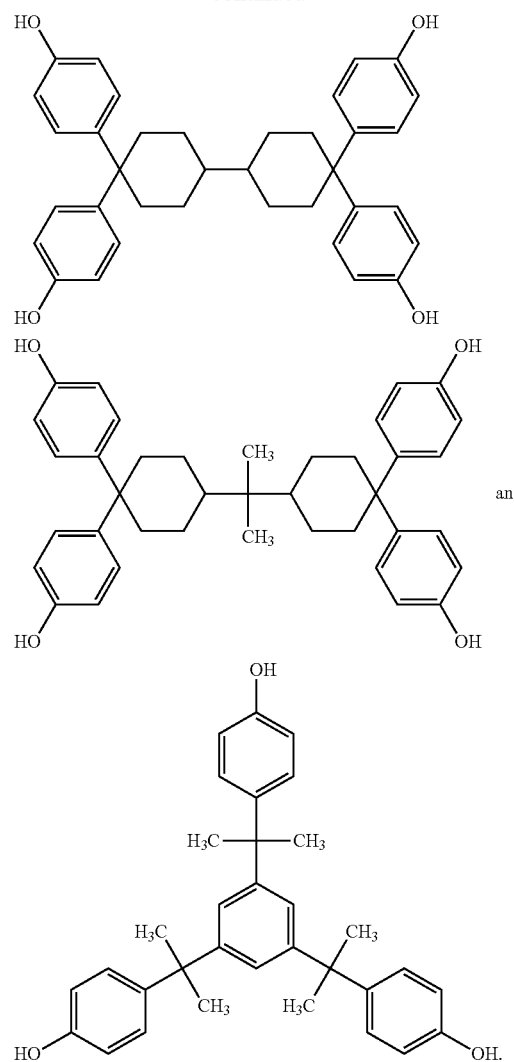
* * * * *